United States Patent [19]

Abbott et al.

[11] Patent Number: 5,302,553
[45] Date of Patent: Apr. 12, 1994

[54] METHOD OF FORMING A COATED PLASTIC PACKAGE

[75] Inventors: Donald C. Abbott, Norton, Mass.; Raymond A. Frechette, N. Providence, R.I.

[73] Assignee: Texas Instruments Incorporated, Dallas, Tex.

[21] Appl. No.: 771,720

[22] Filed: Oct. 4, 1991

[51] Int. Cl.$^5$ ............................................. H01L 21/60
[52] U.S. Cl. ............................ 437/209; 437/211; 437/214; 437/215; 437/219; 174/52.2; 174/52.3; 427/421; 427/427
[58] Field of Search ............... 437/209, 211, 214, 215, 437/219; 29/848, 858, 856; 174/52.2, 52.3, 52.4; 427/427, 421, 34

[56] References Cited

U.S. PATENT DOCUMENTS

| | | | |
|---|---|---|---|
| 4,133,914 | 1/1979 | Zani | 427/421 |
| 4,335,190 | 6/1982 | Bill et al. | 428/623 |
| 4,508,788 | 4/1985 | Cheney | 428/570 |
| 4,631,805 | 12/1986 | Olsen et al. | 437/211 |
| 4,804,805 | 2/1989 | Antonas et al. | 174/52.2 |
| 4,888,307 | 12/1989 | Spairisano et al. | 29/848 |
| 5,057,457 | 10/1991 | Miyahara et al. | 437/211 |
| 5,059,746 | 10/1991 | Hayes et al. | 174/52.2 |
| 5,087,479 | 2/1992 | McManus et al. | 427/421 |
| 5,087,962 | 2/1992 | deVos et al. | 257/687 |

FOREIGN PATENT DOCUMENTS 60-53058 3/1985 Japan .

*Primary Examiner*—Brian E. Hearn
*Assistant Examiner*—Kevin M. Picardat
*Attorney, Agent, or Firm*—Stanton C. Braden; John Vandigriff; Richard L. Donaldson

[57] ABSTRACT

The invention is to a semiconductor package and the method of making the package. A moisture resistant coating such as a ceramic, silica or other plastic material is applied over a plastic packaged semiconductor device to seal the package from moisture.

8 Claims, 1 Drawing Sheet

METHOD OF FORMING A COATED PLASTIC PACKAGE

FIELD OF THE INVENTION

This invention relates to semiconductor devices and more particularly to a plastic packaged semiconductor device having a moisture resistant coating over the plastic package.

BACKGROUND OF THE INVENTION

Plastic packaged semiconductor devices have an cost advantage over hermetic, ceramic packaged semiconductors. The plastic in plastic packages have the disadvantage that moisture absorbed into the package can lead to reliability failures. Failures result from corrosion on the silicon chip, the gold wire connections which are connected to the silicon chip, and on the supporting structure such as the lead frame. As miniaturization components continues, the trend is for thinner and thinner plastic packages. This increases the possibility of moisture absorption into the plastic package.

BRIEF DESCRIPTION OF THE INVENTION

The invention is to a semiconductor package and to the method of making the package. A moisture resistant coating, such as a ceramic coating, is applied over a finished plastic packaged semiconductor device. A ceramic coating is applied using a plasma torch that has a powder feeder. The device is masked to prevent the deposition of the coating on leads used for electrical connections to the device.

After a semiconductor device has been plastic encapsulated, the device is masked to cover areas that are not to be coated. The coating is applied by plasma spraying the moisture resistant material, which may be, for example, alumina, silica, or other material that are non-permeable.

The coating provides a seal impervious to moisture, inhibiting the ingress of moisture along metal leads that protrude from the overmolded plastic by allowing the ceramic coating to coat a small section of the lead next to the plastic to seal this area from moisture. The heat transfer characteristics of the package are improved due to the thermal conductivity and radiant properties of the coating and its intimate contact with the plastic. The coating provides an improved definition of the solder edge that forms when a device is mounted on a substrate by virtue of the ceramic coating serving as a stop or dam to prevent solder from flowing up to the device body.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
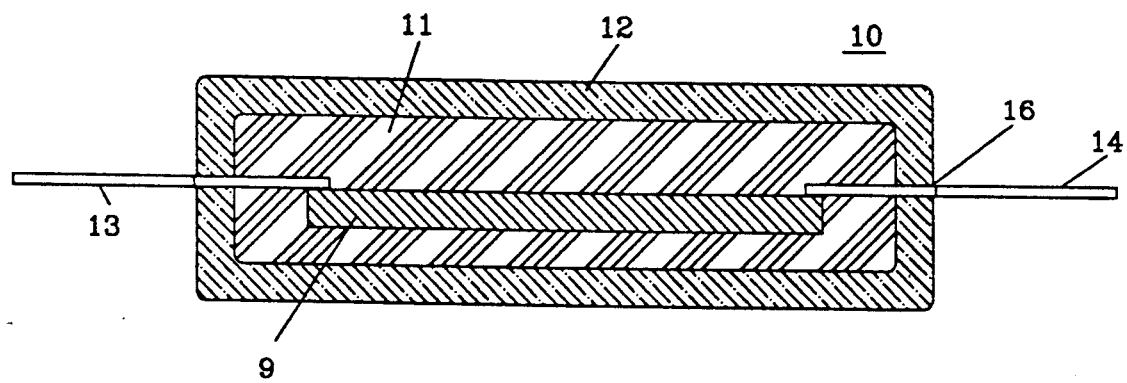
FIG. 1 illustrates a cross-sectional view of a coated plastic package.

The invention is to a plastic encapsulated semiconductor device having a water resistant coating over the plastic encapsulant and to the method of applying the coating. FIG. 1 is a cross-sectional view of a device according to the present invention and illustrates one aspect of the invention. Semiconductor device 10 includes a semiconductor chip 9 having a plurality of leads attached thereto, represented by leads 13 and 14. Semiconductor chip 9 and a part of leads 13 and 14 are encapsulated in a plastic material 11. A coating material of, for example, a ceramic, silica or other water resistant plastic material 12 encapsulates the plastic coating and a part of leads 13 and 14. The coating material extends along each lead as illustrated at numeral 16. The coating material provides a moisture barrier, and the coating on a part of the leads adjacent prevents moisture from entering the package at the lead-plastic interface. The device in FIG. 1 is only illustrative of the invention and is not drawn to scale. The coating in practice would be very thin, only about 0.15 mm.

Figure 2:
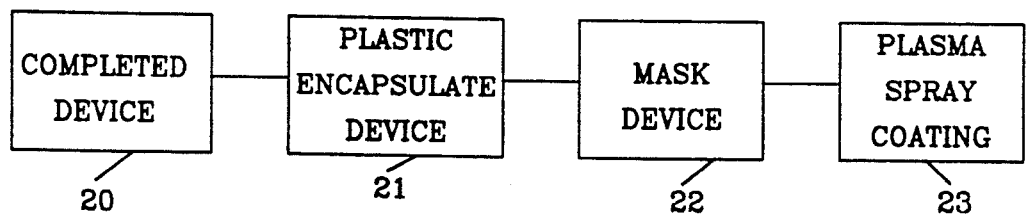
FIG. 2 is a flow diagram of the method steps of the invention.

FIG. 2 illustrates the basic steps in making the semiconductor device encapsulant it and providing the coating. A completed, wired semiconductor chip (20) is encapsulated (21) to provide a finished device. The leads of the plastic encapsulated device are then masked (22) to cover the parts that are to be used to make electrical connection to a socket or circuit board. A coating material is then plasma sprayed (23) onto the masked device.

The coating is accomplished using a plasma torch and a powder feed. The powdered material is sprayed onto the device with the plasma torch. Since the device is masked to protect the connection portions of the leads, the coating is applied only to the plastic body and a small part of the leads adjacent to the device body.

An intermediate step or steps may be desirable prior to spraying the final coating to promote adhesion of the coating.

This step may to abrade the surface of the plastic package to give it a slight textures to provide a surface to which the coating will adhere.

What is claimed is:

1. A method of packaging a semiconductor device having lead wires extending from the package, comprising the steps of:
   encapsulating the semiconductor device and a portion of the lead wires with plastic material; and
   applying a coating of a ceramic material over the plastic material.

2. The method according to claim 1, wherein the coating is a plasma sprayed coating.

3. The device according to claim 1, wherein said coating is alumina.

4. The device according to claim 1, wherein said coating material over the plastic material is a water resistant material.

5. The method according to claim 1, wherein the a portion of the leads are coated with the same material coating the plastic material.

6. The method according to claim 1, including the step of abrading the plastic material to provide a textured surface to improve coating adhesion.

7. A method of packaging a semiconductor device, comprising the steps of:
   encapsulating the semiconductor device with plastic material; and
   plasma spraying a coating material over the plastic material.

8. The method according to claim 7, the step of applying a coating material over the plastic material includes the step of plasma spraying a powered moisture resistant material over the plastic material.

* * * * *